(12) United States Patent
McKee

(10) Patent No.: US 7,804,117 B2
(45) Date of Patent: Sep. 28, 2010

(54) CAPACITOR OVER RED PIXEL

(75) Inventor: Jeffrey A. McKee, Meridian, ID (US)

(73) Assignee: Aptina Imaging Corporation, Grand Cayman (KY)

( * ) Notice: Subject to any disclaimer, the term of this patent is extended or adjusted under 35 U.S.C. 154(b) by 757 days.

(21) Appl. No.: 11/209,779

(22) Filed: Aug. 24, 2005

(65) Prior Publication Data

US 2007/0052055 A1 Mar. 8, 2007

(51) Int. Cl.
*H01L 31/113* (2006.01)
(52) U.S. Cl. ............... 257/292; 257/291; 257/296; 257/369
(58) Field of Classification Search ............. 257/292, 257/291, 296, 369
See application file for complete search history.

(56) References Cited

U.S. PATENT DOCUMENTS

| | | | |
|---|---|---|---|
| 5,942,775 A | 8/1999 | Yiannoulos | |
| 5,955,753 A | 9/1999 | Takahashi | |
| 6,107,655 A | 8/2000 | Guidash | |
| 6,160,281 A | 12/2000 | Guidash | |
| 6,218,656 B1 | 4/2001 | Guidash | |
| 6,232,626 B1 | 5/2001 | Rhodes | |
| 6,352,869 B1 | 3/2002 | Guidash | |
| 6,392,263 B1 | 5/2002 | Chen et al. | |
| 6,423,994 B1 | 7/2002 | Guidash | |
| 6,429,470 B1 | 8/2002 | Rhodes | |
| 6,441,412 B2* | 8/2002 | Oh et al. | 257/292 |
| 6,475,893 B2 | 11/2002 | Giewont et al. | |
| 6,552,323 B2 | 4/2003 | Guidash et al. | |
| 6,657,665 B1 | 12/2003 | Guidash | |
| 6,947,088 B2 | 9/2005 | Kochi | |
| 2004/0149887 A1* | 8/2004 | Agarwal | 250/208.1 |
| 2005/0012168 A1* | 1/2005 | Hong | 257/428 |
| 2005/0167574 A1 | 8/2005 | He | |
| 2006/0164531 A1* | 7/2006 | Yaung et al. | 348/308 |
| 2006/0181622 A1* | 8/2006 | Hong | 348/248 |

FOREIGN PATENT DOCUMENTS

EP 0825651 2/1998

OTHER PUBLICATIONS

International Preliminary Report on Patentability (2 pages).
Written Opinion (4 pages).
Office Action dated Dec. 21, 2009, and English translation, issued in Application No. TW 095131078.

* cited by examiner

*Primary Examiner*—Long Pham
(74) *Attorney, Agent, or Firm*—Dickstein Shapiro LLP

(57) ABSTRACT

A red pixel having a capacitor formed over the photo-conversion region of the pixel. The capacitor can be used by other pixels as a common capacitor. The capacitor is coupled to floating diffusion region shared by a plurality of pixels. The plurality of pixels also share readout circuitry.

18 Claims, 9 Drawing Sheets

US 7,804,117 B2

CAPACITOR OVER RED PIXEL

The invention relates generally to semiconductor imaging devices and in particular to an imager having an array of pixel cells and circuitry for the cells which includes a capacitor.

BACKGROUND OF THE INVENTION

There is a current interest in CMOS active pixel imagers for use as low cost imaging devices. FIG. 1 shows a signal processing system 100 that includes a CMOS active pixel sensor ("APS") pixel array 230 and a controller 232 that provides timing and control signals to enable the reading out of signals stored in the pixels in a manner commonly known to those skilled in the art. Exemplary arrays have dimensions of M×N pixels, with the size of the array 230 depending on a particular application. The imager pixels are readout a row at a time using a column parallel readout architecture. The controller 232 selects a particular row of pixels in the array 230 by controlling the operation of row addressing circuit 234 and row drivers 240. Charge signals stored in the selected row of pixels are provided on column lines to a readout circuit 242. The pixel signals read from each of the columns, typically a reset signal Vrst and an image signal Vsig for each pixel, are then readout sequentially using a column addressing circuit 244 and supplied to a differential amplifier 212 where the difference signal Vrst−Vsig, representing the light seen by a pixel, is converted to digital information in an analog-to-digital (A/D) converter 214 and provided to an image processor 216.

FIG. 2 shows a portion of the system 100 of FIG. 1 in greater detail. FIG. 2 illustrates a four transistor (4T) CMOS pixel 10 in the pixel array 230. The CMOS pixel 10 generally comprises a photo-conversion device 23 for generating and collecting charge generated by light incident on the pixel 10, and a transfer transistor 17 for transferring photoelectric charges from the photo-conversion device 23 to a sensing node, typically a floating diffusion region 5. The floating diffusion region 5 is electrically connected to the gate of an output source follower transistor 19. The pixel 10 also includes a reset transistor 16 for resetting the floating diffusion region 5 to a predetermined voltage (shown as the array pixel supply voltage Vaa_pix); and a row select transistor 18 for outputting a signal from the source follower transistor 19 to an output line in response to an address signal. In this exemplary pixel 10, a capacitor 20 is also included. One plate of the capacitor 20 is coupled to Vaa_pix cell and the other plate of the capacitor 20 is coupled to the floating diffusion region 5. The capacitor 20 need not be present but does have the benefit, when used, of increasing the charge storing capacity of the floating diffusion node 5.

FIG. 3 is a cross-sectional view of a portion of the pixel 10 of FIG. 2 showing the photo-conversion device 23, transfer transistor 17 and reset transistor 16. The exemplary CMOS pixel 10 photo-conversion device 23 may be formed as a pinned photodiode. The photodiode photo-conversion device 23 has a p-n-p construction comprising a p-type surface layer 22 and an n-type accumulation region 21 within a p-type epitaxial active layer 24 formed on a p-type substrate 11. The photodiode photo-conversion device 23 is adjacent to and partially underneath the transfer transistor 17. The reset transistor 16 is on a side of the transfer transistor 17 opposite the photodiode photo-conversion device 23. As shown in FIG. 3, the reset transistor 16 includes a source/drain region 2. The floating diffusion region 5 is between the transfer and reset transistors 17, 16 and is electrically coupled to the gate of the source follower transistor 19 (shown in FIG. 2) and to one plate of the capacitor 20 (shown in FIG. 2), if the latter is used.

In the CMOS pixel 10 depicted in FIGS. 2-3, electrons are generated by light incident on the photo-conversion device 23 and are stored in the n-type accumulation region 21. These charges are transferred to the floating diffusion region 5 by the transfer transistor 17 when the transfer transistor 17 is activated. The source follower transistor 19 produces an output signal based on the transferred charges. A maximum output signal is proportional to the number of electrons extracted from the n-type accumulation region 21.

Conventionally, a shallow trench isolation (STI) region 3 adjacent the charge accumulation region 21 is used to isolate the pixel 10 from other pixels and devices of the image sensor. The STI region 3 is typically formed using a conventional STI process. The STI region 3 is typically lined with an oxide liner and filled with a dielectric material. Also, the STI region 3 can include a nitride liner which provides several benefits, including improved corner rounding near the STI region 3 corners, reduced stress adjacent the STI region 3, and reduced leakage for the transfer transistor 17.

It is desirable to increase the fill factor and charge storage capacity of an array 230 (FIG. 1). However, the inclusion of a capacitor 20, used to increase charge storage capacity, requires space in the array 230. There is a tradeoff of space: the greater space consumed by capacitors in an array the less available for the photo-conversion devices 23. As such, including capacitors in the array 230 effects the fill factor of the array 230. Therefore, it is desirable to include capacitors to increase charge storage capacity without significantly effecting the fill factor of the array 230.

BRIEF SUMMARY OF THE INVENTION

In exemplary embodiments of the invention capacitors are provided in a pixel array in a manner that does not significantly reduce the fill factor of the array.

In one aspect of the invention, a capacitor is provided over a photosensitive region of pixels corresponding to a predetermined color, e.g., red pixels of the array.

In another aspect, a capacitor is provided over one red pixel and the capacitor and read out circuit of that pixel is shared with other different pixels. Since red light is absorbed deeper in the silicon of an array, the capacitor over the photosensitive region of a red pixel does not significantly effect photons received by the red pixel. With neighboring non-red pixels sharing the capacitor and the readout circuit of the red pixel, the size of the photosensitive regions of the pixels can be increased. Accordingly, both fill factor and charge storage capacity are increased.

BRIEF DESCRIPTION OF THE DRAWINGS

These and other features and advantages of the invention will be more readily understood from the following detailed description of the invention which is provided in connection with the accompanying drawings, in which.

DETAILED DESCRIPTION OF THE INVENTION

In the following detailed description, reference is made to the accompanying drawings, which form a part hereof, and in which is shown by way of illustration specific exemplary embodiments of the invention. These embodiments are described in sufficient detail to enable those of ordinary skill in the art to make and use the invention, and it is to be understood that structural, logical or other changes may be made to the specific embodiments disclosed without departing from the spirit and scope of the present invention.

Figure 1:
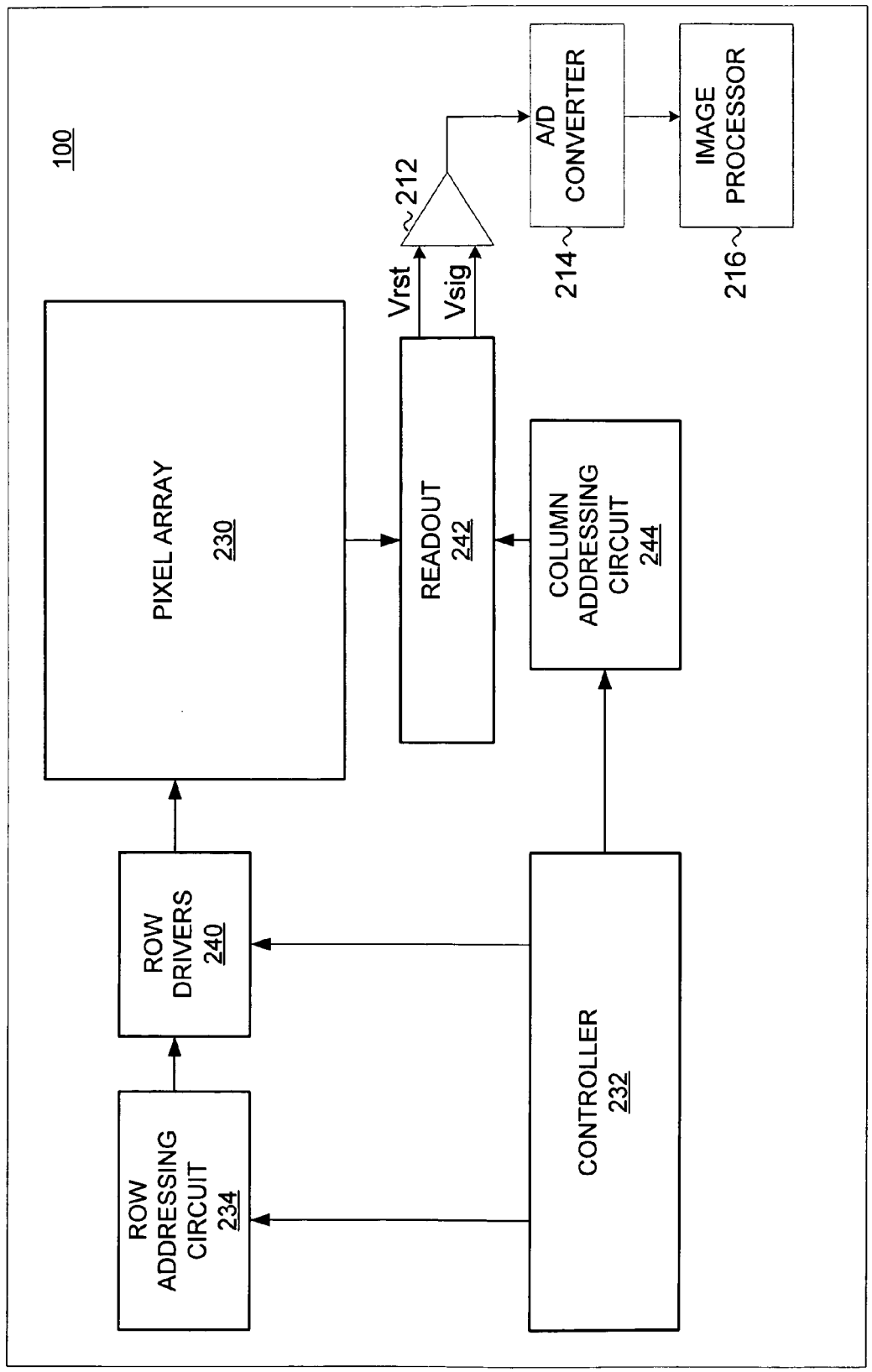
FIG. 1 is a block diagram of a conventional APS system.
Figure 2:
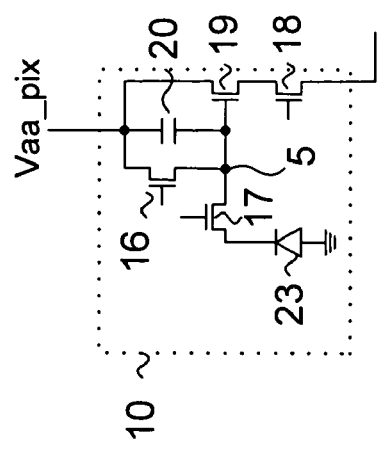
FIG. 2 is a schematic diagram of a representative pixel which may be used in a conventional pixel array of FIG. 1.
Figure 3:
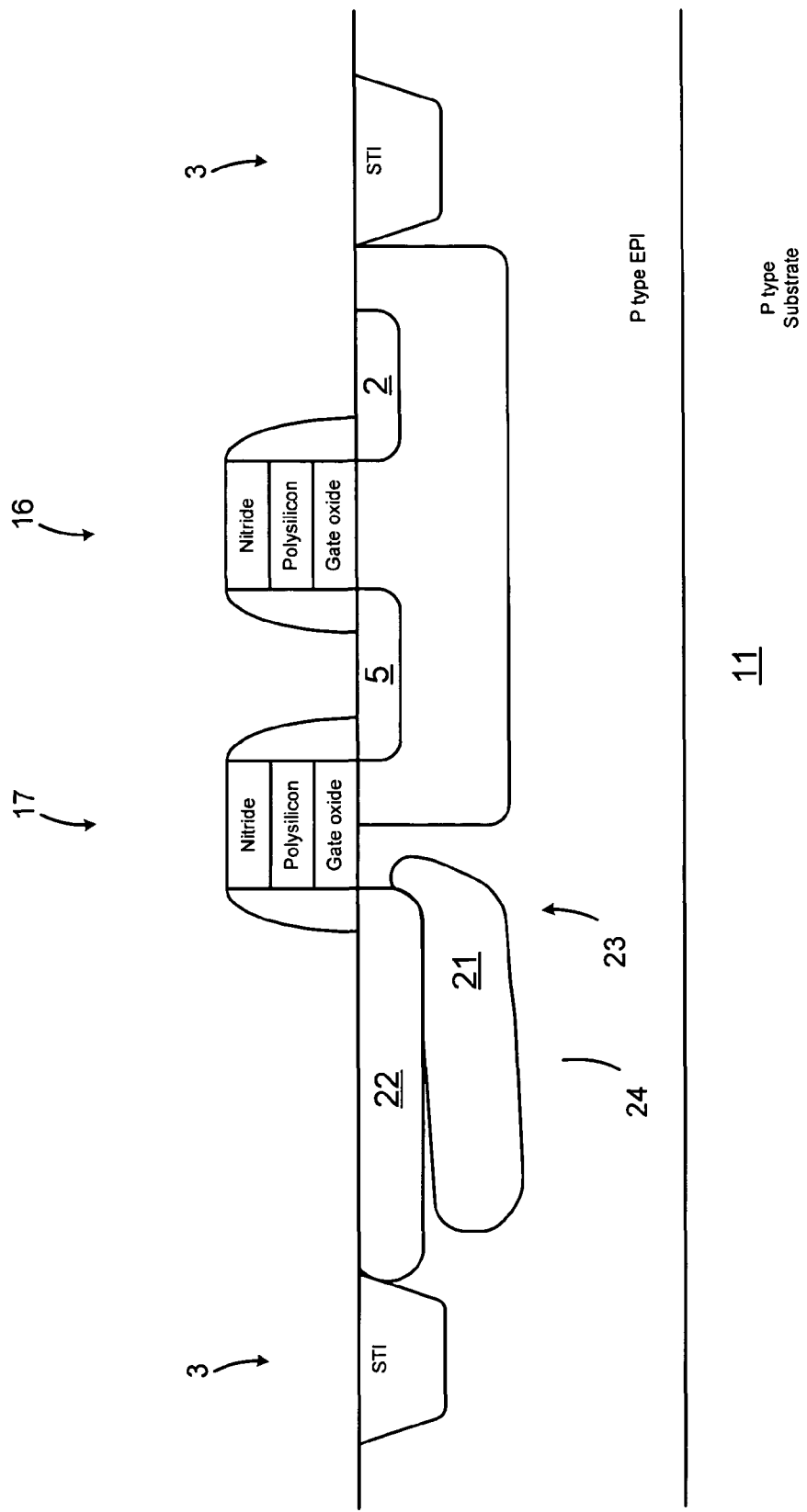
FIG. 3 is a cross-sectional view of a portion of the conventional pixel of FIG. 2.
Figure 4:
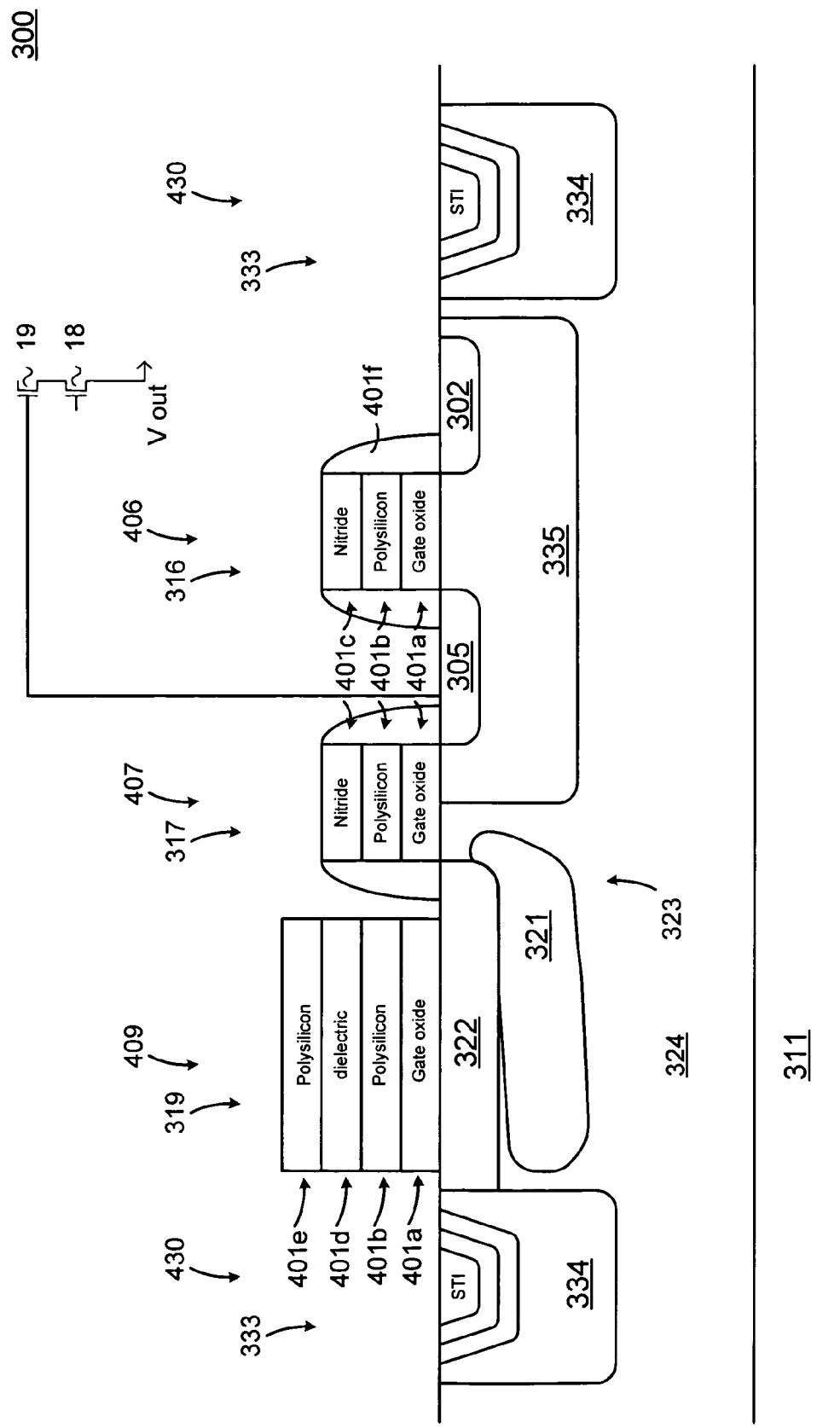
FIG. 4 is a cross-sectional view of a pixel in accordance with an exemplary embodiment of the invention.

FIG. 4 is a cross-sectional view of a portion of pixel 300 according to an exemplary embodiment of the invention. The pixel 300 is similar to the pixel 10 depicted in FIGS. 2-3, except that the pixel 300 includes a capacitor 319 located above the photo-conversion device 323. In the exemplary embodiment, the pixel 300 is a red pixel, e.g., a pixel that receives red light in the form of photons and converts the photons to an electrical charge. A red pixel is one that receives light through a red color filter above the pixel array as is known in the art. The capacitor 319 is electrically connected to a floating diffusion region 305 and Vaa_pix in the manner of capacitor 20 in FIG. 2, which increases the storage capacity of the floating diffusion region 305.

Pixel 300 includes the photo-conversion device 323, a transfer transistor 317 and reset transistor 316. The exemplary photo-conversion device 323 may be formed as a pinned photodiode having a p-n-p construction comprising a p-type surface layer 322 and an n-type accumulation region 321 within a p-type active EPI layer 324 provided over a p-type substrate 311. The photo-conversion device 323 is adjacent to and partially underneath the transfer transistor 317. The reset transistor 316 is on a side of the transfer transistor 317 opposite the photo-conversion device 323. As shown in FIG. 4, the reset transistor 316 includes a source/drain region 302. The floating diffusion region 305 is between the transfer and reset transistors 317, 316 and is contained within a p-well 335. Pixel 300 is bounded by shallow trench isolation (STI) regions 333. Pixel 300 is coupled through floating diffusion region 305 to row select transistor 18 for outputting a signal from the source follower transistor 19.

Capacitor 319 is fabricated as is conventionally known and in a preferred embodiment includes a gate oxide layer 401a, polysilicon layers 401b and 401e, and a dielectric layer 401d. Transistors 316, 317 are fabricated as is conventionally known and in a preferred embodiment includes a gate oxide layer 401a, polysilicon layer 401b, a nitride layer 401c, and sidewalls 401f. Although the invention is described with reference to certain construction elements, the invention is not so limited. For example, layer 401a may be any dielectric material and is not limited to gate oxide. Additionally, as red photons can penetrate farther into a substrate than blue or green photons, the photoconversion device 323 of a red pixel may be deeper into the silicon than photoconversion devices in blue or green pixels. As the red photons may be absorbed at a different level in the silicon, cross talk between red pixels and blue/green pixels can be reduced.

Figure 5:
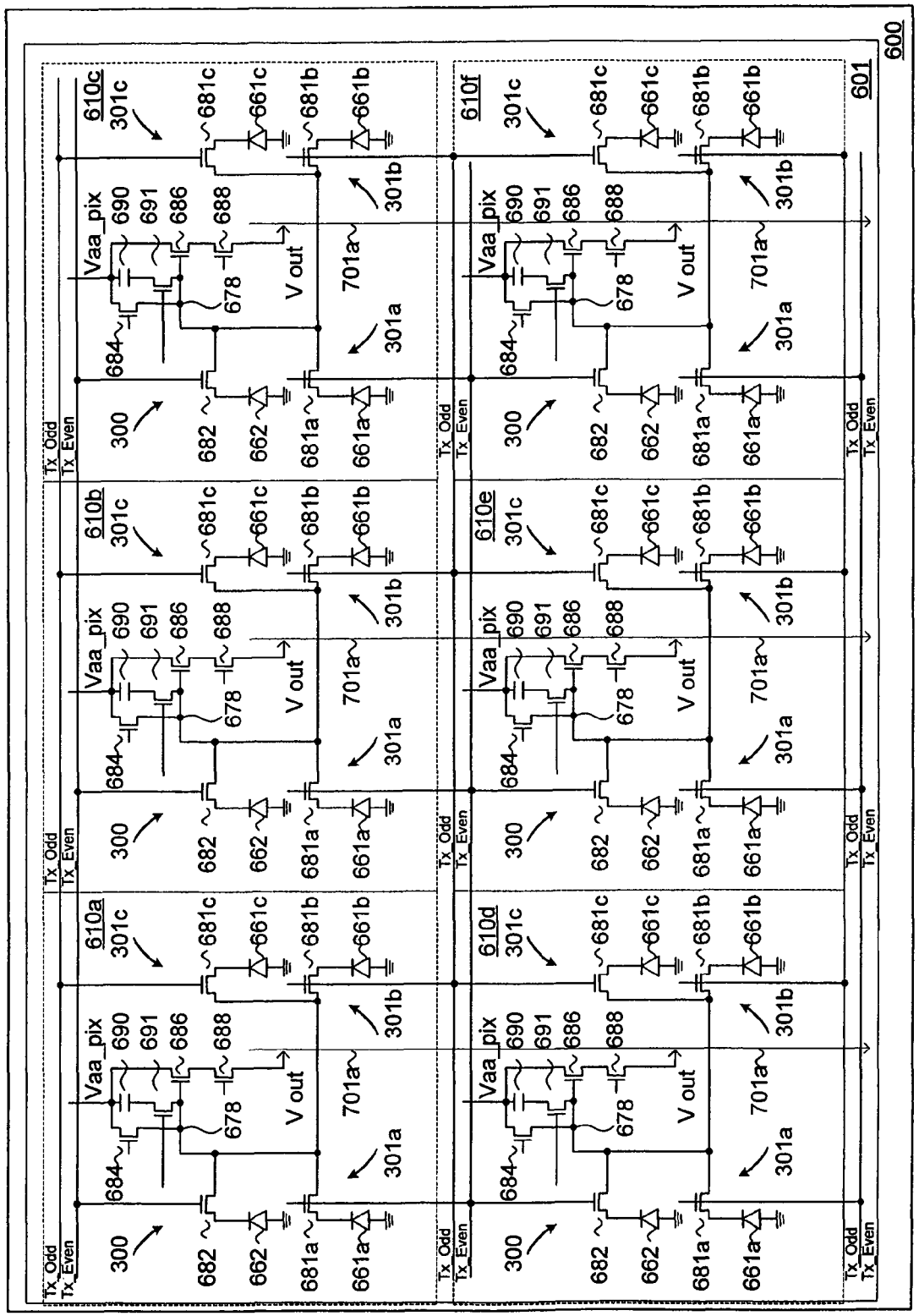
FIG. 5 is a schematic diagram of an imaging device in accordance with another exemplary embodiment of the invention.

A pixel array with capacitors over red pixels is fabricated as conventionally known. For example, "CMOS Imager with Storage Capacitor," U.S. Pat. No. 6,429,470 discloses a technique for fabricating a CMOS imager with a storage cell that can be used by those with skill in the art to fabricate the present invention, the entirety is incorporated by reference. In an exemplary embodiment, the pixel array is fabricated resulting in a gate oxide layer formed over the substrate, and the gate oxide layer under the capacitor that is thicker than the gate oxide under the transfer transistor FIG. 5 shows an electrical schematic of imaging device 600 which includes a pixel 300 in accordance with an exemplary embodiment of the invention. Pixel 300 is part of a four way shared pixel circuit 610a, which, in turn, is part of pixel array 601. The four way shared pixel circuit 610a also includes pixels 301a, 301b, 301c, DCG transistor 691, a common capacitor 690, floating diffusion region 678, reset circuitry (e.g., reset transistor 684) and readout circuitry (e.g., source follower transistor 686 and row select transistor 688). Pixels 301a, 301b, 301c include photodiodes 661a, 661b, 661c and transfer transistors 681a, 681b, 681c, respectively. Although not reflected in FIG. 5, capacitor 690 is disposed over the photodiode photo-conversion device 662, for example, similar to that depicted by capacitor 319 in FIG. 4. In the exemplary embodiment, the pixels 301a, 301b, 301c are non-red pixels, i.e., either blue or green pixels, while pixel 300 is the red pixel. Pixel circuit 610a is representational of pixel circuits 610b, 610c, 610d, 610e, and 610f.

With the pixels 300, 301a, 301b, 301c sharing capacitor 690 disposed over the photo-conversion region of red pixel 300, the capacitor 690 does not take space in the pixel array of imaging device 600 used by the photo-conversion regions of the pixel 300 or pixels 301a, 301b, 301c. As such, the pixel array 601 of imaging device 600 includes capacitors and can take advantage of the benefits that accompany the inclusion of capacitor into the circuit of a pixel array 601 without affecting the fill factor of the pixel array 601. For example, as noted above, a capacitor can be coupled to a floating diffusion region to increase the storage capacity and light sensitivity of the pixel.

Figure 6:
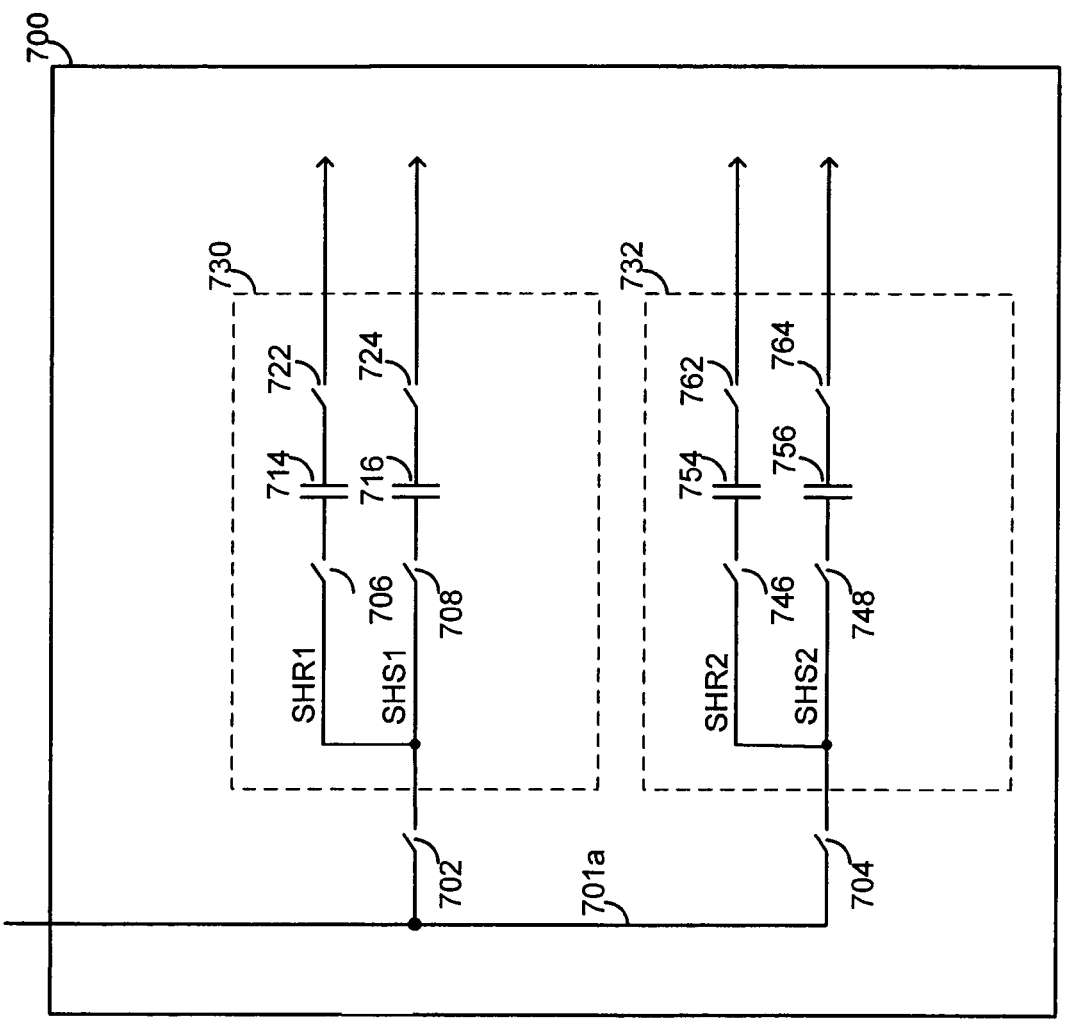
FIG. 6 is a schematic diagram of an sample and hold circuit.

FIG. 6 is a schematic diagram of a portion of a sample and hold circuit 700 in accordance with an exemplary embodiment of the invention. Although only one sample and hold circuit 700 is depicted, sample and hold circuit 700 is representative of a sample and hold circuit 700 for each column of pixels in the pixel array. As indicated above, in an exemplary embodiment two signals are read out from each pixel, thus four signals are read out from each pixel circuit, e.g., Vrst1, Vsig1 for the first pixel and Vrst2, Vsig2 for the second pixel.

In an exemplary embodiment, signals are read from the pixel array 601 (FIG. 5) pixel row by pixel row starting with the top pixel row and proceeding incrementally to the bottom pixel row. For example, pixels 300 and 301c of pixel circuit 610a, pixels 300 and 301c of pixel circuit 610b, and pixels 300 and 301c of pixel circuit 610c would be readout at substantially the same time. Then, pixels 301a and 301b of pixel circuit 610a, pixels 301a and 301b of pixel circuit 610b, and pixels 301a and 301b of pixel circuit 610c would be readout at substantially the same time. Then, pixels 300 and 301c of pixel circuit 610d, pixels 300 and 301c of pixel circuit 610e, and pixels 300 and 301c of pixel circuit 610f would be readout at substantially the same time. Then, pixels 301a and 301b of pixel circuit 610d, pixels 301a and 301b of pixel circuit 610e, and pixels 301a and 301b of pixel circuit 610f would be readout at substantially the same time. The row by row readout of the pixel array continues until the last row of the array.

In an exemplary embodiment as seen in FIG. 6, each of the four signals received from the associated pixel circuit are separately stored in the sample and hold circuit 700. Sample and hold circuit 700 has two subcircuits 730, 732 for respectively storing signals from each of the two pixels in a pixel circuit. Each subcircuit 730, 732 is mutually selectively coupled to the column line 701a through respective switches 702, 704. In one aspect, one signal, e.g., enable, is provided to one switch, e.g., switch 702, and the complement of the signal, e.g., disable, is provided to other switch, e.g., switch 704. Thus only one subcircuit 730, 732 is coupled to column 701a at a time. Each subcircuit 730, 732 has two capacitors 714, 716, 754, 756, for storing Vrst1, Vsig1, Vrst2, Vsig2 respectively. Capacitors 714, 716, 754, 756 are selectively coupled to the column line 701a through switches 706, 708, 710, 746, 748, respectively which are controlled by control signals SHR1, SHS1, SHR2, and SHS2. Capacitors 714, 716, 754, 756 are selectively coupled to downstream circuitry through switches 722, 724, 762, 764, respectively. The stored Vrst1, Vsig1, Vrst2, Vsig2, signals can be read out and if preferred, combined, in a many different ways as is conventionally known.

Figure 7:
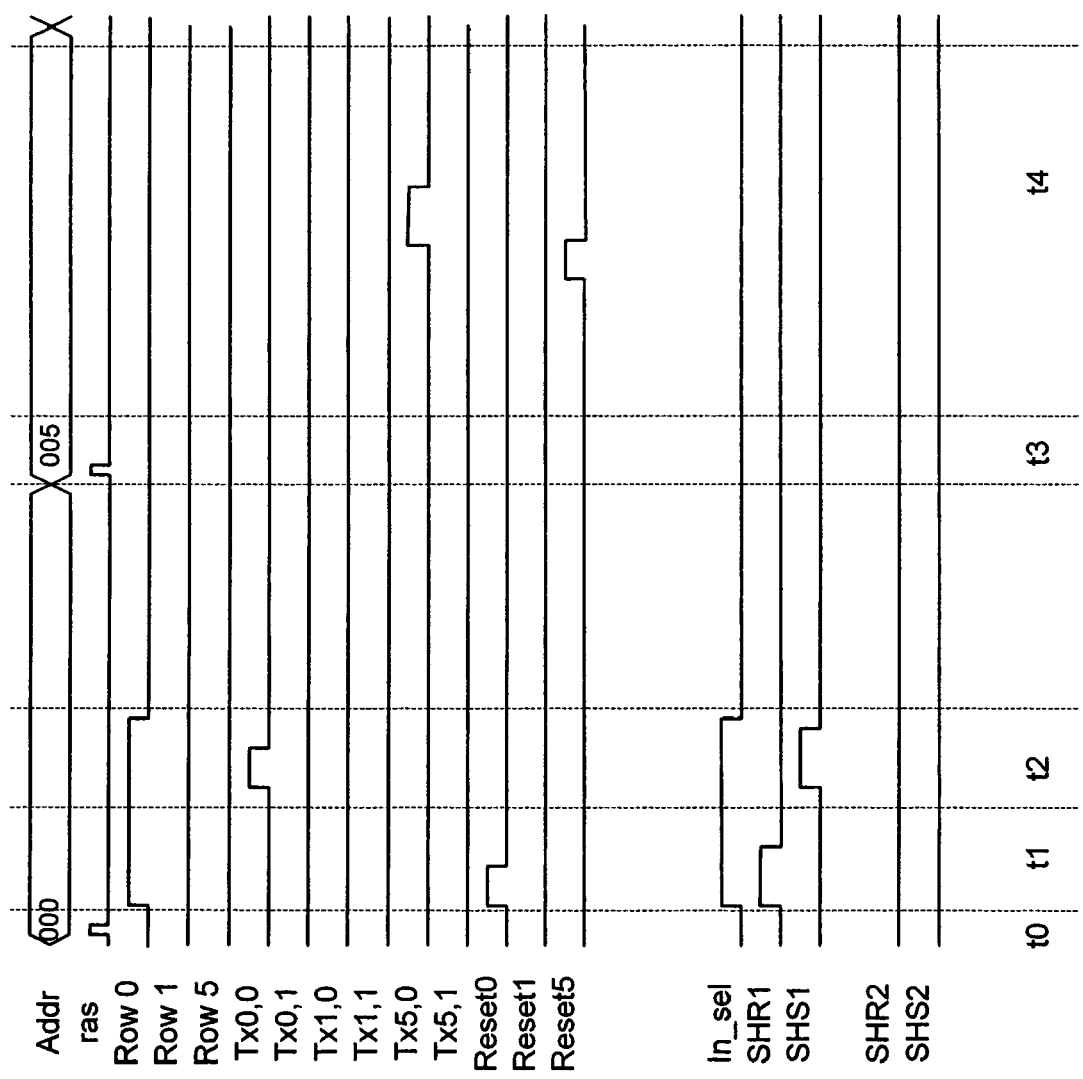
FIG. 7 is a timing diagram depicting the partial operation of the circuits of FIGS. 6 and 7.

FIG. 7 is a timing diagram depicting a partial operation of the pixel array 601 of FIG. 5 and the sample and hold circuit 700 of FIG. 6 in accordance with an exemplary embodiment of the invention. For simplicity, the readout of one pixel is depicted and is representational of the other pixels being readout. In the timing diagram of FIG. 7, the signals are active "high," i.e., high logic state. A pixel circuit row is a row of pixel circuits, e.g., 610a, 610b, 610c (FIG. 5). A pixel row is a row of pixels, e.g., 300, 301c (FIG. 5). The first row of pixel circuits is, e.g., circuits 610a, 610b, 610c (FIG. 5); the second row of pixel circuits is, e.g., circuits 610d, 610e, 610f (FIG. 5). The first pixel row is Row 0, e.g., pixels 300 and 301c of pixel circuit 610a, pixels 300 and 301c of pixel circuit 610b, and pixels 300 and 301c of pixel circuit 610c (FIG. 5); the second pixel row is Row 1, e.g., pixels 301a and 301b of pixel circuit 610a, pixels 301a and 301b of pixel circuit 610b, and pixels 301a and 301b of pixel circuit 610c (FIG. 5). Row 5 is not depicted in FIG. 5, but is described as part of the timing diagram of FIG. 7.

In FIG. 7, Addr is the row address of the row being readout and ras is the read address signal. ROW 0, ROW 1, and ROW 5 are representational of the row select gate signals for rows 0, 1, and 5, respectively. In implementation, a global row select signal is provided to the row decode circuitry, which AND's the row select signal with the Addr signal to provide the row select gate signal to the appropriate row. For example, if Addr is "000", then the row decode provides a row select gate signal to row 0. TX0,0, TX0,1, TX1,0, TX11,1, TX5,0, and TX5,1 are the representational transfer gate signals for row 0, first pixel, e.g., pixel 300 of pixel circuit 610a, row 0, second pixel, e.g., pixel 301c of pixel circuit 610a, row 1, first pixel, e.g., pixel 301a of pixel circuit 610a, row 1, second pixel, e.g., pixel 301b of pixel circuit 610a, row 5, first pixel, e.g., pixel 301a of pixel circuit 610X (a pixel row five rows below row 0, not shown in FIG. 5), row 5, second pixel, e.g., pixel 301b of pixel circuit 610X (a pixel row five rows below row 0, not shown in FIG. 5). In implementation, global transfer gate signals are provided to the column decode circuitry, which decodes the global transfer gate signal and the current desired column to provide the transfer gate signal to the appropriate column. For example, during an odd column read (e.g., first, third, fifth, etc.) of the pixel array the column decode circuitry will generate an odd Tx signal, e.g., TxY,0 that will enable a corresponding transfer gate in a corresponding row "Y", e.g., Tx gates 682 and 681a. During an even column read (e.g., second, fourth, sixth, etc.) of the pixel array the column decode circuitry will provide an enable signal on the even Tx signal, e.g., TxZ,1 that will enable corresponding transfer gates in a row "Z", e.g., Tx gates 681c and 681b. Reset0, Reset1, and Reset5 are the representational reset gate signals for rows 0, 1, and 5, respectively. In implementation, a global reset signal is provided to the row decode circuitry, which AND's the reset signal with the Addr signal to provide the reset signal to the appropriate row.

In FIG. 7, the In_sel signal indicates which subcircuit 730, 732 of sample and hold circuit 700 is active (FIG. 6). For example, if In_sel is high, then switch 702 is closed and subcircuit 730 is coupled to the column line 701a (FIG. 6). SHR1, and SHS1 are the control signals that enable switches 706, 708 to couple capacitors 714, 716 to the column line 701a, respectively. SHR2 and SHS2 are the control signals that enable switches 746, 748 to couple capacitors 754, 756 to the column line 701a, respectively.

In FIG. 7, time period t0 indicates the initial setup time period during which the row address of the pixels cells to be readout is provided. In this example during t0, an Addr of 000 is provided, which corresponds to the first pixel row, e.g., Row0 of the pixel array 601. Although the example describes the readout from one pixel, e.g., pixel 300 (FIG. 5), this example is representational of all of "odd" pixels in a row being readout at substantially the same time as is conventionally known. It is representational of all of the "even" pixels in a row being readout at substantially the same time.

During time period t1, pixel 300 is reset and the reset charge is stored as follows. Control signals Row0, Reset0, In_sel and SHR1 are enabled (i.e., asserted high). The Row0 signal closes switch 688 and couples pixel 301a to a column line 701a (FIG. 5). The Reset0 signal closes switch 684 and couples Vaa_pix to the pixel 301a (FIG. 5). The In_sel signal closes switch 702 (and opens switch 704) and couples subcircuit 730 to column line 701a (FIG. 6). The SHR1 signal closes switch 706 and couples capacitor 714 to pixel 301a through column line 701a. Thus, at the end of time period t1, pixel 301a is reset and the reset voltage of the pixel 301a is stored in the sample and hold circuit 700. Control signals Reset0 and SHR1 are disabled (i.e., driven low) by the end of time period t1. The integration time of the pixel array requires calculating the integration time to reflect two pixel circuit rows being accessed. Although discussed in terms of enabling and disabling a control signal, this series of actions may also be referred to as pulsing—asserting/deasserting—a control signal as is commonly known.

During time period t2, the integration charge (i.e., photosignal) of the pixel circuit 610a is readout and stored as follows. Control signals Tx0,0 and SHS1 are enabled (i.e., driven high). The Tx0,0 signal closes switch 682 of pixel circuit 610a and couples photo-conversion device 662 to the floating diffusion region 678. The SHS1 signal closes switch 708 and couples capacitor 716 to pixel 300 through column line 701a. The charge stored on floating diffusion region 605a is read out and stored on the capacitor 716. Thus at the end of time period t2, the signal voltage Vsig1 of the pixel 301a is stored in the sample and hold circuit 700. Control signals Tx0,0 and SHS1 are disabled (i.e., driven low) by the end of time period t2.

If a photogate is used in place of a photodiode, the photogate is controlled to be enabled (i.e., driven high) after a delay of Tx0,0 signal being enabled (i.e., driven high) to prevent charge under the photodiode photo-conversion device from blooming during readout. In a preferred embodiment, the delay is 100 ns. As the photodiode photo-conversion device 662 is brought to zero volts during readout, any electrons that cannot fit in the floating diffusion will be drained to Vaa_pix through the reset gate 684.

During time period t3, the integration process is commenced for a row five rows ahead of Row0. As is commonly known, when a mechanical shutter is not used, a row of pixels is initiated for integration in advance of the readout. In the exemplary embodiment, a row is initiated five rows ahead of the current row being readout. As such, since Row0 has been readout, Row5 is then prepared for integration. Time period t3 indicates the initial setup time period during which the row address of the pixels cells to be initiated is provided. In this example during time period t3, an Addr of 005 is provided. Although the example describes the initiation of one pixel this is representational of all of pixels in a pixel row of a being initiated at substantially the same time as is conventionally known.

In time period t4, control signals Reset5 and Tx5,0 in pixel 301a in a pixel circuit 610y are enabled (i.e., driven high). Pixel 301a of pixel circuit 610y (not illustrated in FIG. 5) is a pixel row similar to Row 0 and five pixel rows below pixel row 0. The Reset5 signal closes switch 684 (a switch in pixel circuit 610y not illustrated in FIG. 5 that is similar to switch 684) and couples Vaa_pix to the pixel 610y. The Tx5,0 signal closes switch 682 (switches in pixel circuit 610y not illustrated in FIG. 5 that are similar to switch 682) and couples photodiode photo-conversion device 662y (a photodiode photo-conversion device in pixel circuit 610y not illustrated in FIG. 5 that are similar to photo-conversion device 662) to Vaa_pix. Thus at the end of time period t5, pixel 301a of pixel circuit 610y is reset and ready for integration. Control signals Reset5, and Tx5,0 are disabled (i.e., driven low) (FIG. 5). After which, the pixel 301a in pixel circuit 610y integrates.

As is conventionally known, a readout from a pixel array actually comprises a series of successive readouts. During initial readouts from the pixel array different adjustments and calculations may occur. For example, during the initial readouts exposure settings are adjusted. After a first readout of the pixel array, the values read from the array are computed and exposure is adjusted. A pixel array is readout a second time and the values read from the array are computed and exposure is again adjusted. The final, usable readout from the pixel array may occur after several initial readouts. As such, the pixel is readout in a rolling manner, i.e., that if pixel array has 100 rows and the pixel array is successively readout from row 0 to 99, then on subsequent readouts of the pixel array, row 0 is readout after row 99. Thus, in the present example when row 95 is being readout, row 0 (five rows ahead) is initiated for readout. While the invention describes a five row ahead initiation, the invention is not so limited.

In another aspect of the invention, when a mechanical shutter is used, the integration of the pixels is not required to be initiated five rows in advance. As such, when a mechanical shutter is used, a timing diagram for the readout of the pixel array would be similar to that as shown in FIG. 7, but would not include the time periods t3 and t4.

Figure 8:
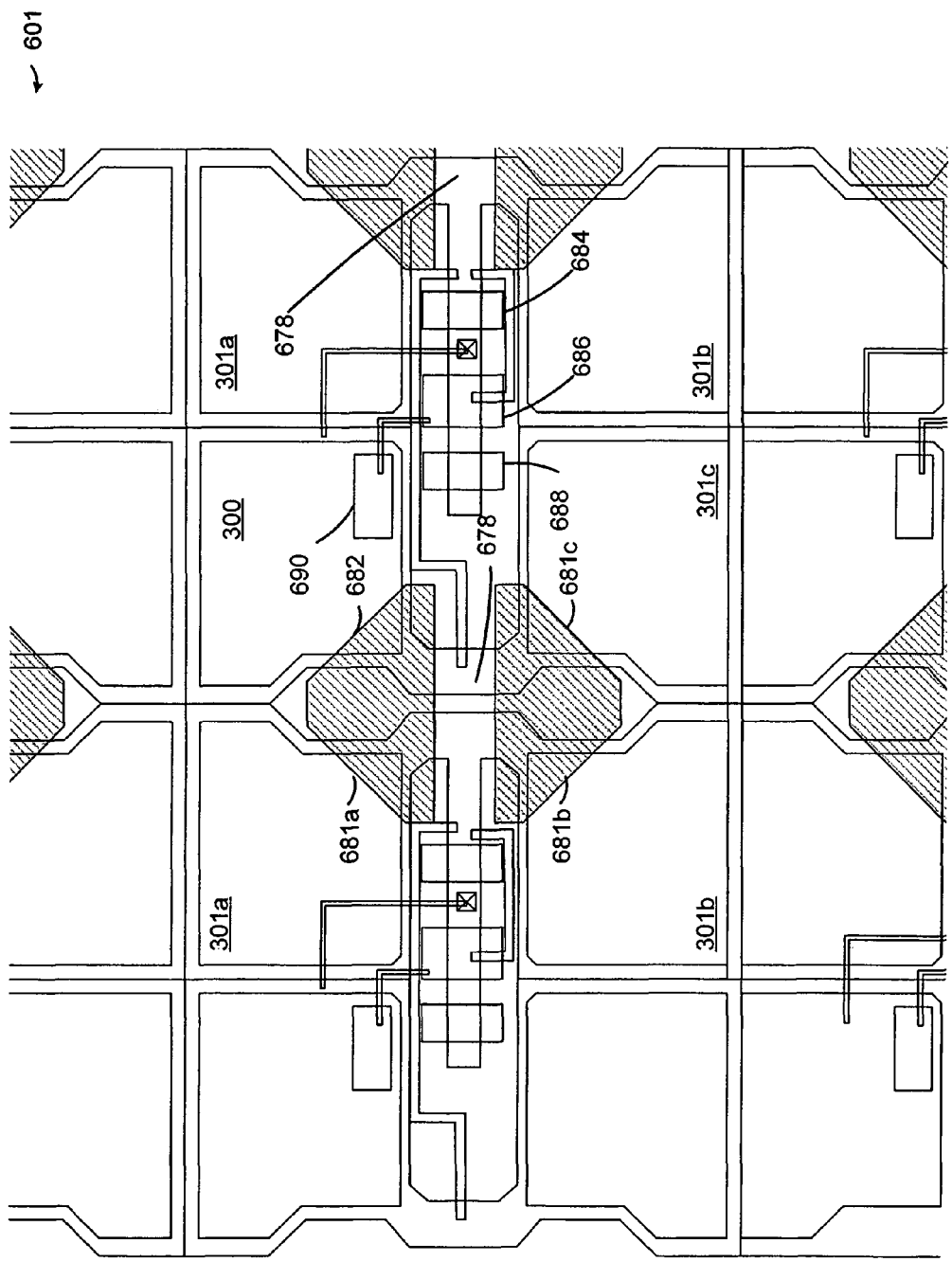
FIG. 8 is a plan view of the layout of the device of FIG. 6.

FIG. 8 shows a top down layout view of a portion of the pixel array 601 of FIG. 5. As depicted in FIG. 8, a capacitor 690 is disposed over a red photodiode photo-conversion device in pixel 300 and shared by red photodiode photo-conversion device in pixel 300, green photodiode photo-conversion device 301a, blue photodiode photo-conversion device in pixel 301b, and green in pixel photodiode photo-conversion device 301c. Each pixel 300, 301a, 301b, and 301c has a respective transfer transistor 682, 681a, 681b, and 681c. These four pixels 300, 301a, 301b, and 301c share a common reset transistor 684 and readout circuitry, i.e., source follower transistor 686, row select 688, and floating diffusion 678.

Figure 9:
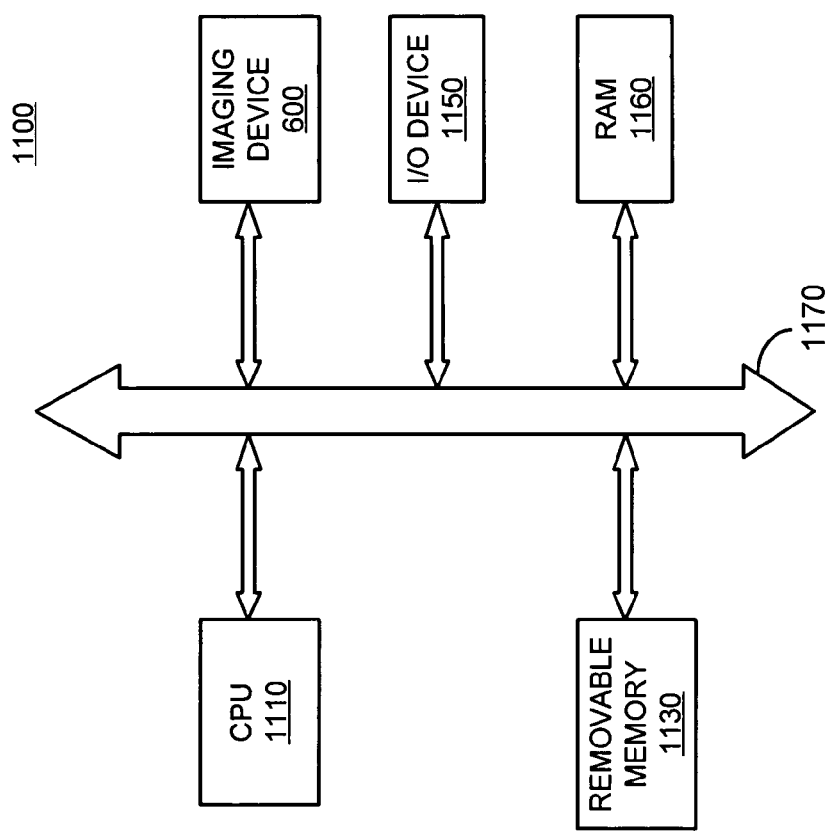
FIG. 9 is a block diagram showing a processor system incorporating at least one imaging device constructed in accordance with an embodiment of the invention.

FIG. 9 shows a system 1100, a typical processor system modified to include an imager device 600 (as constructed in FIGS. 5-6). The system 1100 is exemplary of a system having digital circuits that could include image sensor devices. Without being limiting, such a system could include a computer system, camera system, scanner, machine vision, vehicle navigation, video phone, surveillance system, auto focus system, star tracker system, motion detection system, image stabilization system, and other image acquisition or processing system.

System 1100, for example a camera system, generally comprises a central processing unit (CPU) 1110, such as a microprocessor, that communicates with an input/output (I/O) device 1150 over a bus 1170. Imaging device 600 also communicates with the CPU 1110 over the bus 1170. The system 1100 also includes random access memory (RAM) 1160, and can include removable memory 1130, such as flash memory, which also communicate with the CPU 1110 over the bus 1170. The imaging device 600 may be combined with a processor, such as a CPU, digital signal processor, or microprocessor, with or without memory storage on a single integrated circuit or on a different chip than the processor.

It should be appreciated that other embodiments of the invention include a method of manufacturing the system 1100. For example, in one exemplary embodiment, a method of manufacturing an CMOS readout circuit includes the steps of providing, over a portion of a substrate corresponding to a single integrated circuit, at least a pixel array with shared capacitors placed over red pixels (FIG. 5) as described above using known semiconductor fabrication techniques.

While the invention has been described and illustrated with reference to specific exemplary embodiments, it should be understood that many modifications and substitutions can be made without departing from the spirit and scope of the invention. For example, although the invention is described with respect to the capacitor disposed above the photo-conversion region of a red pixel being coupled to the floating diffusion region of a pixel, the invention is not so limited, and the capacitor may be coupled to other parts of the pixel or an array containing the pixel. Additionally, a capacitor may be underneath a filter that only passes red light. Accordingly, the invention is not to be considered as limited by the foregoing description but is only limited by the scope of the claims.

What is claimed as new and desired to be protected by Letters Patent of the United States is:

1. A pixel array, comprising:
   at least first and second pixels having respective photo-conversion regions, where said first pixel is a red pixel; and
   a capacitor electrically coupled to said first pixel, the entire capacitor directly over said photo-conversion region of said first pixel.

2. The pixel array of claim 1, wherein said second pixel is either a blue or green pixel.

3. The pixel array of claim 1, further comprising a floating diffusion region coupled to said first pixel, said capacitor being electrically coupled to said floating diffusion region.

4. The pixel array of claim 2, wherein the pixel array is formed on a substrate and the photo-conversion region of said first pixel extends deeper into the substrate than the photo-conversion region of said second pixel.

5. The pixel array of claim 1, wherein said photo-conversion regions are photodiodes.

6. The pixel array of claim 5, wherein said first pixel is in a first row of the pixel array, said second pixel is in a second row of said pixel array, said first row being above said second row.

7. An integrated circuit, comprising:
   a pixel array, comprising:
     at least first and second pixels having respective photo-conversion regions, where said first pixel is a red pixel; and
     a capacitor electrically coupled to said first pixel, the entire capacitor directly over said photo-conversion region of said first pixel.

8. The integrated circuit of claim 7, wherein said second pixel is either a blue or green pixel.

9. The integrated circuit of claim 8, further comprising a floating diffusion region coupled to said first pixel, said capacitor being electrically coupled to said floating diffusion region.

10. The integrated circuit of claim 7, wherein said photo-conversion regions are photodiodes.

11. An imaging system, comprising:
    a pixel array, comprising:
      at least first and second pixels having respective photo-conversion regions, where said first pixel is a red pixel; and
      a capacitor electrically coupled to said first pixel, the entire capacitor directly over said photo-conversion region of said first pixel.

12. The imaging system of claim 11, wherein said second pixel is either a blue or green pixel.

13. The imaging system of claim 12, further comprising a floating diffusion region coupled to said first pixel, said capacitor being electrically coupled to said floating diffusion region.

14. The imaging system of claim 11, wherein said photo-conversion regions are photodiodes.

15. A processor system, comprising:
    a processor; and
    an imager, comprising:
    a pixel array, comprising:
      at least first and second pixels having respective photo-conversion regions, where said first pixel is a red pixel; and
      a capacitor electrically coupled to said first pixel, the entire capacitor directly over said photo-conversion region of said first pixel.

16. The imaging system of claim 15, wherein said second pixel is either a blue or green pixel.

17. The imaging system of claim 16, further comprising a floating diffusion region coupled to said first pixel, said capacitor being electrically coupled to said floating diffusion region.

18. The imaging system of claim 17, wherein said photo-conversion regions are photodiodes.

\* \* \* \* \*